(12) United States Patent
Afzali-Ardakani et al.

(10) Patent No.: US 8,138,492 B2
(45) Date of Patent: Mar. 20, 2012

(54) FORMATION OF CARBON AND SEMICONDUCTOR NANOMATERIALS USING MOLECULAR ASSEMBLIES

(75) Inventors: Ali Afzali-Ardakani, Ossining, NY (US); Cherie R. Kagan, Bala Cynwyd, PA (US); Laura L. Kosbar, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/973,063

(22) Filed: Dec. 20, 2010

(65) Prior Publication Data

US 2011/0204318 A1 Aug. 25, 2011

Related U.S. Application Data

(63) Continuation of application No. 12/199,516, filed on Aug. 27, 2008, now Pat. No. 7,855,133, which is a continuation of application No. 11/433,586, filed on May 15, 2006, now Pat. No. 7,544,546.

(51) Int. Cl.
*H01L 29/06* (2006.01)
*H01L 21/28* (2006.01)
(52) U.S. Cl. ........................ 257/9; 257/E21.19; 977/762
(58) Field of Classification Search ......... 257/9, E21.19; 977/762
See application file for complete search history.

(56) References Cited

U.S. PATENT DOCUMENTS

| | | | |
|---|---|---|---|
| 6,270,946 B1 | 8/2001 | Miller | |
| 6,882,051 B2 | 4/2005 | Majumdar et al. | |
| 6,979,489 B2 | 12/2005 | Lu et al. | |
| 7,105,428 B2 | 9/2006 | Pan et al. | |
| 7,301,779 B2 | 11/2007 | Honlein et al. | |
| 7,442,575 B2 | 10/2008 | Coffer | |
| 7,498,215 B2 | 3/2009 | Hashimoto et al. | |
| 2004/0079195 A1 | 4/2004 | Perry et al. | |
| 2005/0230356 A1 | 10/2005 | Empedocles et al. | |
| 2005/0287717 A1 | 12/2005 | Heald et al. | |
| 2007/0231790 A1* | 10/2007 | Su ..................................... | 435/5 |
| 2008/0202579 A1* | 8/2008 | Gur et al. ...................... | 136/252 |

OTHER PUBLICATIONS

H. Dai, *Acc. Chem. Res.* 35, 1035 (2002).
J. Liu, S. Fan, H. Dai, MRS Bull. April, 244 (2004).
C. M. Lieber, *MRS Bull.* July, 286 (2003).
J. Li, C. Lu, B. Maynor, S. Huang, J. Liu, *Chem. Mat.* 16, 1633 (2004).
H. Yuang, X. Duan, Q. Wei. C. Lieber, *Science* 291, 630 (2001).
N. Franklin, H. Dai, Adv. Mat. 12, 890 (2000).
H. Dai, Acc. Chem. Res. 35, 1035 (2002).

(Continued)

*Primary Examiner* — Luan C Thai
(74) *Attorney, Agent, or Firm* — Connolly Bove Lodge & Hutz LLP

(57) ABSTRACT

The invention is directed to a method of forming carbon nanomaterials or semiconductor nanomaterials. The method comprises providing a substrate and attaching a molecular precursor to the substrate. The molecular precursor includes a surface binding group for attachment to the substrate and a binding group for attachment of metal-containing species. The metal-containing species is selected from a metal cation, metal compound, or metal or metal-oxide nanoparticle to form a metallized molecular precursor. The metallized molecular precursor is then subjected to a heat treatment to provide a catalytic site from which the carbon nanomaterials or semiconductor nanomaterials form. The heating of the metallized molecular precursor is conducted under conditions suitable for chemical vapor deposition of the carbon nanomaterials or semiconductor nanomaterials.

10 Claims, 4 Drawing Sheets

OTHER PUBLICATIONS

J. Liu, S. Fan, H. Dai, *MRS Bulletin*, April, 244 (2004).
S. Rosenblatt et. al., *Nano Lett*. 2, 869 (2002).
J. Hu, T. W. Odom, C. M. Lieber, *Acc. Chem. Res*. 32, 435 (1999).
The International Preliminary Report on Patentability issued in related International Application No. PCT/US07/68196 O Jun. 9, 2011.
A. Ulman, *Chem. Rev.* 96, 1533 (1996).
L. Brousseau and T. Mallouk, *Anal Chem*. 69, 679 (1997).
M. Anderson, et.al. *J. Vac. Sci. Technol*. B 21, 3116, (2003).
C. Lin, C. R. Kagan, *J. Am. Chem. Soc*. 125, 336 (2002).
M. Ansell et.al. *Langmuir* 16, 1172 (2000).
S. Sun et. al. *J. Am Chem. Soc*. 124, 2884 (2002).
H . Dai, *Acc. Chem. Res*. 35, 1035 (2002).
Hostetler et al., Dynamics of Place-Exchange Reactions on Monolayer-Protected Gold Cluster Molecules, University of North Carolina, Langmuir 15, 3782-3789, 1999.
Eftekhari et al, High-Yeild Synthesis of Carbon Nanotubes Using a Water-Soluble Catalyst Support in Catalytic Chemical Vapor Deposition, Iran, Letters to Editor/Carbon 44 (2006) 1343-1345, Jan. 9, 2006.

* cited by examiner

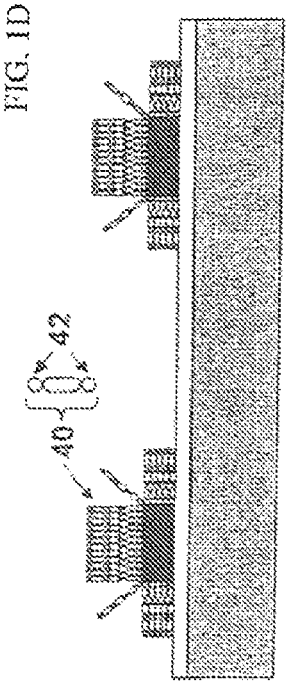
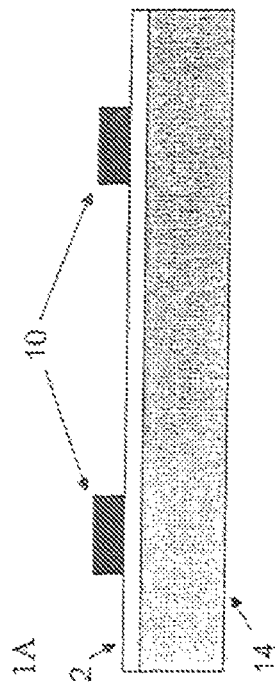
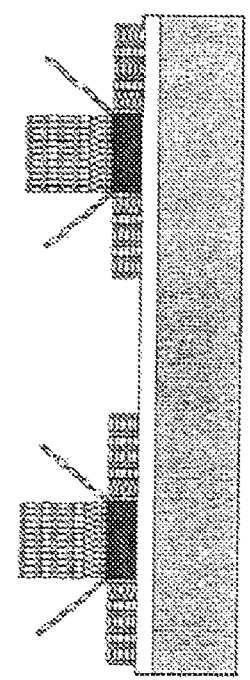
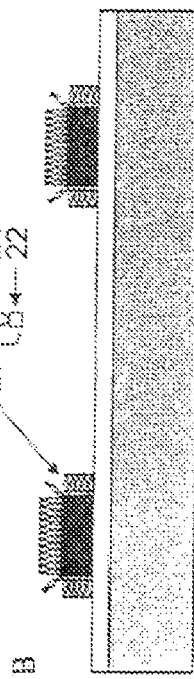
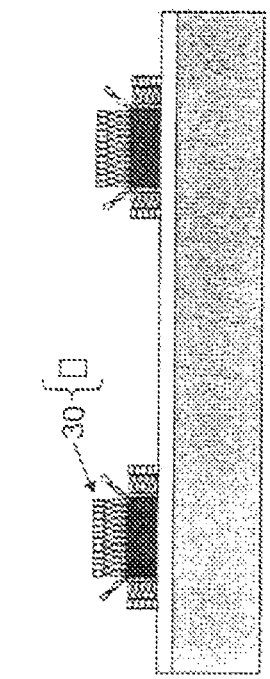
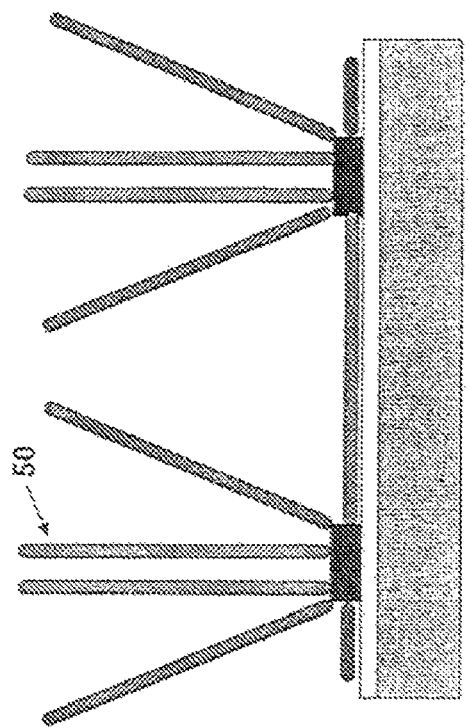

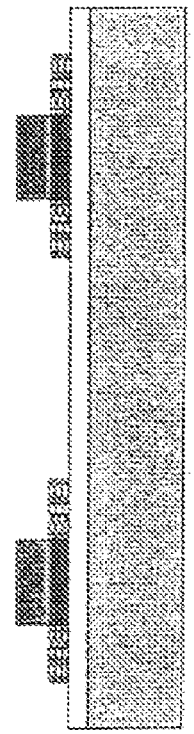
FIG. 2A
FIG. 2B
FIG. 2C
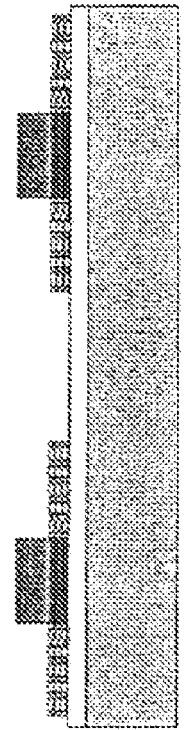
FIG. 2D
FIG. 2E
FIG. 2F
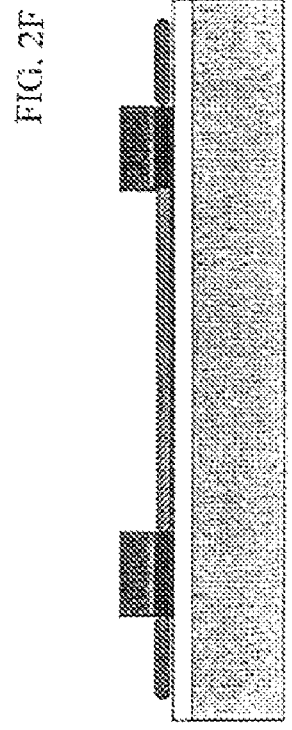
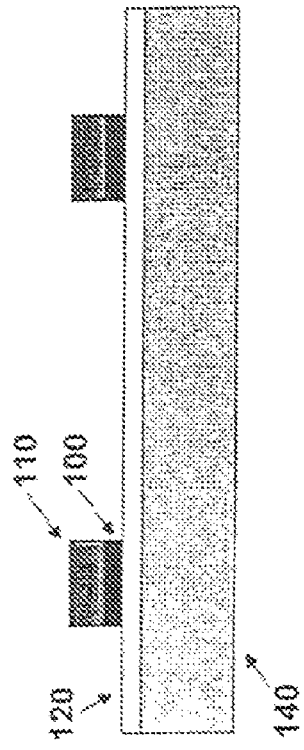
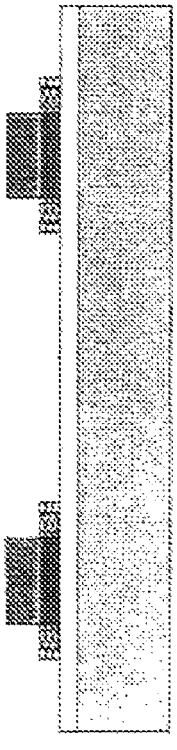

FORMATION OF CARBON AND SEMICONDUCTOR NANOMATERIALS USING MOLECULAR ASSEMBLIES

RELATED APPLICATIONS

This application is a continuation of application Ser. No. 12/199,516, filed on Aug. 27, 2008 (allowed); which is a continuation of application Ser. No. 11/433,586, filed on May 15, 2006 (now U.S. Pat. No. 7,544,546); the entire contents of each application is hereby incorporated by reference

FIELD OF THE INVENTION

This invention relates to the use of molecular assemblies to direct the formation of carbon nanomaterials and semiconductor nanomaterials. The invention also relates to electronic and optoelectronic devices made with carbon and semiconductor nanomaterials formed using the molecular assemblies.

BACKGROUND OF THE INVENTION

Carbon nanotubes, which can be either semiconducting or metallic, are typically grown by arc discharge, laser ablation, or chemical vapor deposition. The nanotubes are then harvested from the growth surface for subsequent use [H. Dai, Acc. Chem. Res. 35, 1035 (2002)]. Once harvested, one remaining challenge is to position the carbon nanomaterials for use in devices, e.g., positioning them between electrodes on selected substrates for electronic, optoelectronic or sensing applications. At the research level, individual carbon nanotubes are commonly brought into contact with electrodes by one of two techniques. In one instance, the carbon nanotubes can be deposited onto surfaces patterned with electrodes by spin-coating from a dispersion. However, only a small portion of the individual nanotubes actually come in contact with the electrodes. A second technique involves spin-coating the carbon nanotubes on a surface prior to electrode deposition. The electrodes are subsequently deposited with or without alignment of the electrodes to the carbon nanotubes. The successful formation of electrical devices using carbon nanotubes is limited by serendipitous electrode patterning or random nanotube deposition or if the electrodes are intentionally aligned to the nanotubes, to small numbers of devices.

At the research level the attractive performance of carbon nanotubes in electronics and optoelectronics has been demonstrated, however, challenges remain with regard to scale-up of carbon nanotube device application and, in particular, in providing reliable contacts between the nanotubes and the electrodes of the device. Routes that form carbon nanotubes in selected areas of a substrate avoiding exposure of the nanotubes to the potentially harmful solvents and oxidation processes used in harvesting, purification, and placement have recently been shown to form better performing devices. [J. Liu, S. Fan, H. Dai, MRS Bull. April, 244 (2004)].

Semiconductor nanowires are also typically grown by chemical vapor deposition and harvested from the growth surface for further use. A semiconductor nanowire is a one-dimensional semiconductor. The semiconductor materials can be Group IV (such as Si, Ge, or an alloy), Group III-V (such as GaAs), Group II-VI (such as CdSe, CdS, ZnS), Group IV-VI (such as PbSe) Thus, they face many of the same challenges in alignment and placement as carbon nanotubes for device applications [C. M. Lieber, MRS Bull. July, 286 (2003)]. Again, the process of harvesting and positioning nanowires on surfaces subjects the nanostructures to potentially harmful conditions. Methods for in-place growth of nanowires are therefore preferred. [J. Li, C. Lu, B. Maynor, S. Huang, J. Liu, Chem. Mat. 16, 1633 (2004)].

Microfluidics has been used to orient and selectively deposit nanowires and nanotubes on surfaces, but microfluidic channels are typically limited to micron widths by the fluidics of liquid flow at small dimensions [H. Yuang, X. Duan, Q. Wei. C. Lieber, Science 291, 630 (2001)]. Microfluidic approaches also would require the use of surfactants to disperse the nanowires and nanotubes in the delivery solutions. The presence of surfactants, particularly for nanotube deposition, can significantly affect the electronic properties of the nanotubes or nanowires unless the surfactants can be removed from the resulting nanomaterials. This approach requires the separate growth, harvesting, and placement of nanowires and nanotubes.

Ordered networks of suspended carbon nanotubes have been grown between regularly positioned silicon posts by patterning the catalysts on the posts and growing the nanotubes until they reach another post. [N. Franklin, H. Dai, Adv. Mat. 12, 890 (2000)]. In addition electric fields have been used to control the direction of nanotube growth by taking advantage of their high polarizability [H. Dai, Acc. Chem. Res. 35, 1035 (2002)]. In both instances, the nanotubes are suspended above the substrate surface. For many electronic and optoelectronic device applications, the nanotube is preferably in contact with the substrate surface, e.g., the gate dielectric of a transistor for conductance modulation.

Carbon nanotubes and semiconductor nanowires have been formed as vertical arrays on surfaces by spatially positioning catalytic sites. This approach typically provides a high density of at least locally ordered nanotubes and nanowires that extend perpendicular to the substrate surface. Although this approach may eliminate the need to harvest and place the nanotubes or nanowires in some applications, vertical arrays of these materials place severe constraints on device geometries and assumes that the growth surface is amenable to the desired device structure.

To position the catalysts for nanotube or nanowire growth on surfaces, lithographic processing is commonly used. The catalysts used are either metal containing organic molecules or nanoparticles of metal or metal oxide [For examples see J. Liu, S. Fan, H. Dai, MRS Bulletin, April, 244 (2004); S. Rosenblatt et. al., Nano Lett. 2, 869 (2002); and J. Hu, T. W. Odom, C. M. Lieber, Acc. Chem. Res. 32, 435 (1999)]. Lithographic patterning of surfaces is useful across the substrate plane, but does not provide a route to pattern surfaces vertically.

SUMMARY OF THE INVENTION

The invention is directed to a method of forming carbon or semiconductor nanomaterials. The method comprises providing a substrate and attaching a molecular precursor to the substrate, wherein the molecular precursor includes a surface binding group for attachment to the substrate (a "head group") and a binding group for attachment of metal-containing species (a "tail group"). The method includes complexing the binding group with a metal-containing species, the metal-containing species selected from a metal cation, metal compound, or metal or metal-oxide nanoparticle to form a metallized molecular precursor. The method can further include complexing the metal-containing species with a ligand and additional metal-containing species that may be added repeatedly to increase the amount of metal on the surface. The metallized molecular precursor is then subjected to a heat treatment to provide a catalytic site from which the carbon or semiconductor nanomaterials form.

The method of the invention can be used to make a transistor. In one embodiment, the method comprises providing a first electrode and a second electrode on a gate dielectric, and attaching a molecular precursor to the first electrode, the second electrode or both the first and the second electrodes. The molecular precursor includes a surface binding group for attachment to at least one electrode and a binding group for attachment of metal-containing species. The method further includes complexing the binding group for attachment of metal-containing species with a metal-containing species selected from a metal cation, metal compound, or metal or metal-oxide nanoparticle to form a metallized molecular precursor. The metallized molecular precursor is then subjected to a heat treatment to provide a catalytic site from which the carbon or semiconductor nanomaterials form.

In another embodiment, the method of making a transistor comprises providing at least two segments of a non-reactive layer on a gate dielectric, and providing a first electrode and a second electrode on each of the at least two non-reactive layers. A molecular precursor is then attached to the first electrode, the second electrode or both the first and the second electrodes, wherein the molecular precursor includes a surface binding group for attachment to at least one electrode and a binding group for attachment of metal-containing species. The method further includes complexing the binding group for attachment of metal-containing species with a metal-containing species selected from a metal cation, metal compound, or metal or metal-oxide nanoparticle to form a metallized molecular precursor. The metallized molecular precursor is then subjected to a heat treatment to provide a catalytic site from which the carbon or semiconductor nanomaterials form above the gate dielectric.

The invention is also directed to a method of making an electronic device structure. The method comprises providing a patterned electronic surface selected from a patterned metal surface, patterned dielectric surface or patterned semiconductor surface, and attaching a molecular precursor to the patterned electronic surface. The molecular precursor includes a surface binding group for attachment to the patterned electronic surface and a binding group for attachment of metal-containing species. The method further includes complexing the binding group for attachment of metal-containing species with a metal-containing species selected from a metal cation, metal compound, or metal or metal-oxide nanoparticle to form a metallized molecular precursor. The metallized molecular precursor is then subjected to a heat treatment to provide a catalytic site on the patterned electronic surface from which the carbon or semiconductor nanomaterials form.

BRIEF DESCRIPTION OF THE DRAWINGS

These and other features of the present invention will become apparent upon consideration of the following detailed description of the invention when read in conjunction with the drawings, in which:

FIGS. 1(a) to 1(f) is a schematic for one method of making an electronic device with a select orientation of carbon or semiconductor nanomaterials;

FIG. 2 is a schematic for another method of making an electronic device with a select orientation of carbon or semiconductor nanomaterials;

DETAILED DESCRIPTION OF THE INVENTION

Figure 3:
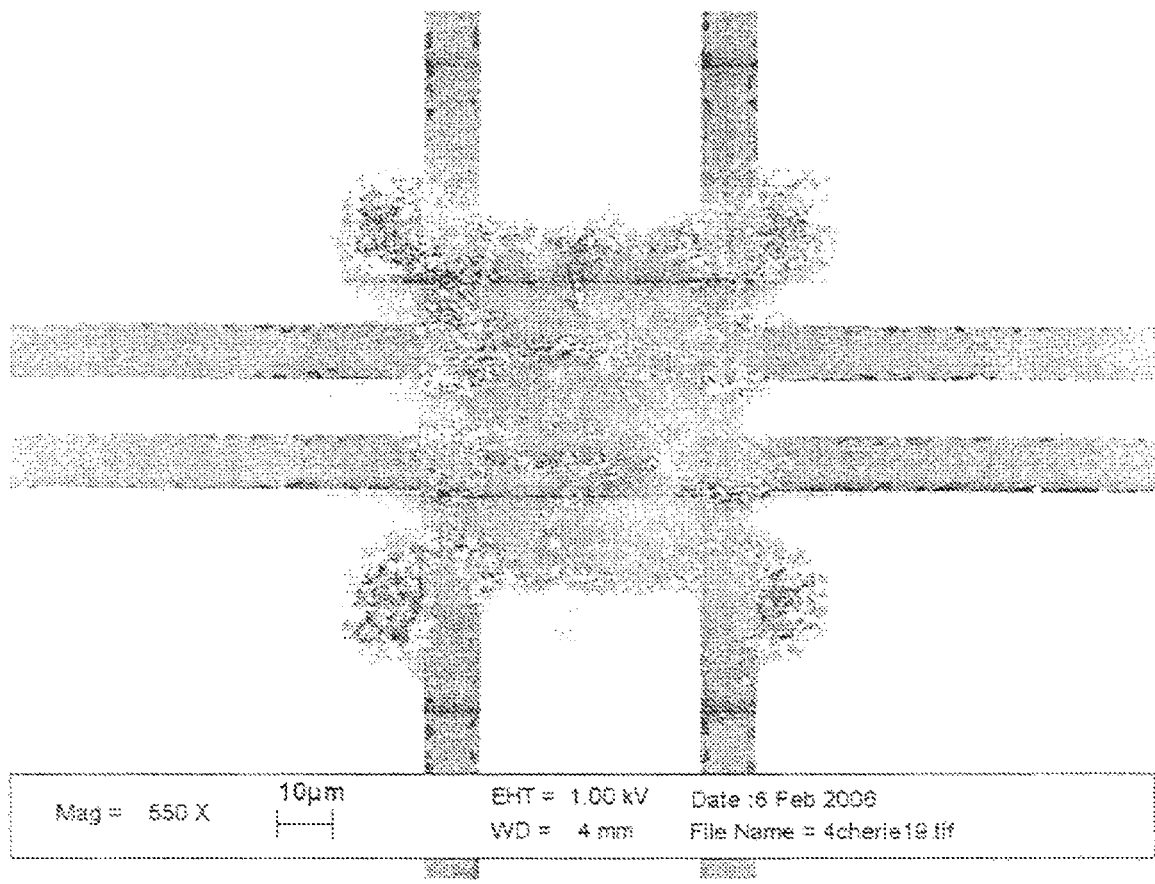
FIG. 3 is a scanning electron micrograph of grown carbon nanotubes using a process of the invention.

The invention is directed to a process to selectively position nanomaterials, e.g., carbon nanotubes or semiconductor nanowires, using an assembly of molecular precursors attached to a select substrate surface. By relying on various chemical interactions the molecular precursors self-assemble on a selected surface. Exemplary surfaces on which to selectively grow carbon or semiconductor nanomaterials include device surfaces such as an electrode surface used in field-effect transistors, light emitting diodes, photovoltaic devices and sensors.

The molecular assemblies formed in the process are used to selectively position catalytic sites for carbon nanomaterial or semiconductor nanomaterial formation in device structures. The chemical specificities of the molecular assemblies, and in particular, how the molecular assemblies selectively bind to surfaces, for example, the surfaces of metals, dielectrics and semiconductors, provide the necessary degree of control to the process. The assembled molecules act as sites to bind metal cations, metal compounds, or nanoparticles of metal or metal oxide, resulting in the selective placement of catalytic sites for forming nanomaterials, e.g., carbon nanotubes or semiconductor nanowires.

The invention is directed to a method of forming carbon nanomaterials or semiconductor nanomaterials. The method comprises providing a substrate and attaching a molecular precursor to the substrate. The molecular precursor includes a surface binding group for attachment to the substrate and a binding group for attachment of metal-containing species. The metal-containing species is selected from a metal cation, metal compound, or metal or metal-oxide nanoparticle to form a metallized molecular precursor. The metallized molecular precursor is then heated to provide a catalytic site from which the carbon or semiconductor nanomaterials form. The heating of the metallized molecular precursor is conducted under conditions suitable for chemical vapor deposition of the carbon or semiconductor nanomaterials.

The substrate can be a patterned metal, a patterned metal oxide or a patterned dielectric.

The surface binding group is selected from a thiol, an isocyanide, an organic acid, a silane or a diene. If the substrate comprises silicon, the surface binding group will typically be a diene or if the substrate comprises silicon oxide the surface binding group will typically be a chloro or alkoxy silane. If the substrate comprises metal or semiconductors, the surface binding group will typically be a thiol or isocyanide. If the substrate comprises a metal oxide, the surface binding group will typically be an organic acid.

In one embodiment, the surface binding group is a thiol and the substrate comprises one or more metals selected from the group consisting of gold, palladium, platinum and copper. In another embodiment, the surface binding group is a thiol and the substrate is a semiconductor material selected from silicon, germanium or gallium arsenide.

The binding group for attachment of metal-containing species will typically include a nitrogen heterocycle, an organic acid, a thiol or an isocyanide. These ligand functional groups are used to complex with a variety of metal-containing species selected from a metal cation, a metal compound or a metal or metal oxide nanoparticle. The metal-containing species will likely contain a metal selected from the group consisting of iron, cobalt, nickel, palladium, platinum, rhodium, ruthenium, titanium, zirconium and gold.

The method of the invention can also include attaching a coordinating organic ligand to the metallized molecular precursor and attaching additional metal-containing species to the coordinated organic ligand.

The molecular precursor used in the method of the invention can also include a photosensitive group that is displaced from the binding group for attachment of metal-containing species upon exposure to radiation. The removal of the photosensitive group activates the molecular precursor to a metal-containing species selected from a metal cation, a metal compound or a metal or metal oxide nanoparticle.

The molecular precursor used in the method of the invention can also include a body portion disposed between the surface binding group and the binding group for attachment of metal-containing species. The body portion can provide a sufficient intermolecular interaction with neighboring attached molecular precursors to form a molecular monolayer. Moreover, the body portion can also include a photosensitive group that causes the displacement of the binding group for attachment of metal-containing species. The removal of the photosensitive group deactivates the molecular precursor to metallization.

The method of the invention can be used to make a transistor. In one embodiment, the method comprises providing a first electrode and a second electrode on a gate dielectric or a substrate, and attaching a molecular precursor to the first electrode, the second electrode or both the first and the second electrodes. The molecular precursor includes a surface binding group for attachment to at least one electrode and a binding group for attachment of metal-containing species. The metal-containing species is selected from a metal cation, metal compound, or metal or metal-oxide nanoparticle to form a metallized molecular precursor. The metallized molecular precursor is then heated to provide a catalytic site from which the carbon or semiconductor nanomaterials form. The heating of the metallized molecular precursor is conducted under conditions suitable for chemical vapor deposition of the carbon or semiconductor nanomaterials.

The method can also include providing a lithographic channel between the first and the second electrode to allow the carbon nanomaterials or semiconductor nanomaterials to form substantially between the two electrodes.

In one embodiment, the first electrode and the second electrode are different materials such that the molecular precursor attaches substantially to the first electrode with little, if any, attachment to the second electrode. As a result, the complexing of the metal-containing species occurs predominately at the binding group for metal attachment associated with the molecular precursor that becomes attached to the first electrode.

In another embodiment, the first electrode and the second electrode are capped with a non-reactive layer such that the molecular precursor attaches substantially at the sidewalls of the electrodes. Following complexation and heating, the formed carbon nanomaterials or semiconductor nanomaterials form along the surface of the gate dielectric.

The invention is also directed to a method of making a transistor in which the nanomaterials formed by the method are suspended above the gate dielectric or substrate surface (might later underfill with dielectric). The method comprises providing at least two segments of a non-reactive layer on a gate dielectric or substrate, and providing a first electrode and a second electrode on each of the at least two non-reactive layers. The molecular precursors are then attached to the first electrode, the second electrode or both the first and the second electrodes. The molecular precursor includes a surface binding group for attachment to at least one electrode and a binding group for attachment of metal-containing species. The metal-containing species is selected from a metal cation, metal compound, or metal or metal-oxide nanoparticle to form a metallized molecular precursor. The metallized molecular precursor is then heated to provide a catalytic site from which the carbon or semiconductor nanomaterials form. The heating of the metallized molecular precursor is conducted under conditions suitable for chemical vapor deposition of the carbon or semiconductor nanomaterials.

The first electrode and the second electrode can comprise different materials such that the molecular precursor attaches substantially to the first electrode with little, if any, attachment to the second electrode. As a result, the complexing of the metal-containing species occurs predominately at the binding group for metal attachment associated with the molecular precursor that becomes attached to the first electrode. In certain instances, it may be advantages to limit growth to the sides of the electrodes. In such a case, the first electrode and the second electrode are capped with a non-reactive layer such that the molecular precursor attaches substantially at the sidewalls of at least one of the electrodes.

The inventive process can provide several advantages over the making of electronic devices. Some of these advantages include:

(a) the positioning of the carbon or semiconductor nanomaterials can be controlled by the device geometry and the attachment chemistry between the device surfaces (e.g., dielectric materials, metals or metal oxides, and semiconductor materials) and the surface binding groups of the molecular precursors;

(b) carbon or semiconductor nanomaterials can be selectively positioned in lithographic channels along the interface with the gate dielectric, e.g., as in field effect transistors without the typical problems associated with the positioning and handling of preformed carbon or semiconductor nanomaterials;

(c) the size and density of the carbon or semiconductor nanomaterials that form can be controlled by selecting the type and density of the catalytic sites; and (d) the overlap between the substrate and the carbon or semiconductor nanomaterial may be the same from device-to-device, reducing variability in device-to-device on-current, and potentially provide more direct contact with source and drain electrodes.

With respect to point (b), the inventive process eliminates the need for separate growth and placement processes and overcomes the unsolved problem of positioning large numbers of carbon or semiconductor nanomaterials in devices. Also, the inventive process avoids the potentially harmful exposure of harvested nanomaterials to further processing. In addition, the inventive process can be combined with known lithographic approaches to semiconductor processing.

In particular, the inventive process can be used in combination with a photosensitive molecular precursor as described in copending U.S. patent application, entitled, "Photosensitive self-assembled monolayers and uses thereof", filed on the same date as this application and assigned to International Business Machines, the entire disclosure of which is incorporated herein by reference. As described therein, the photosensitive molecular precursors can function as a negative or positive resist depending upon the photosensitive functionality present in the molecule.

In one embodiment, the photosensitive functional group selectively cleaves the molecular precursor (displacing the binding group for attachment of metal-containing species)

upon exposure to radiation. Consequently, the exposed molecular precursor can no longer be metallized, and thereby functions as a negative resist.

In another embodiment, the photosensitive functional group is displaced upon exposure to radiation. Consequently, the binding group for attachment of metal-containing species that is exposed to the radiation is activated toward metallization, thereby functioning as a positive resist.

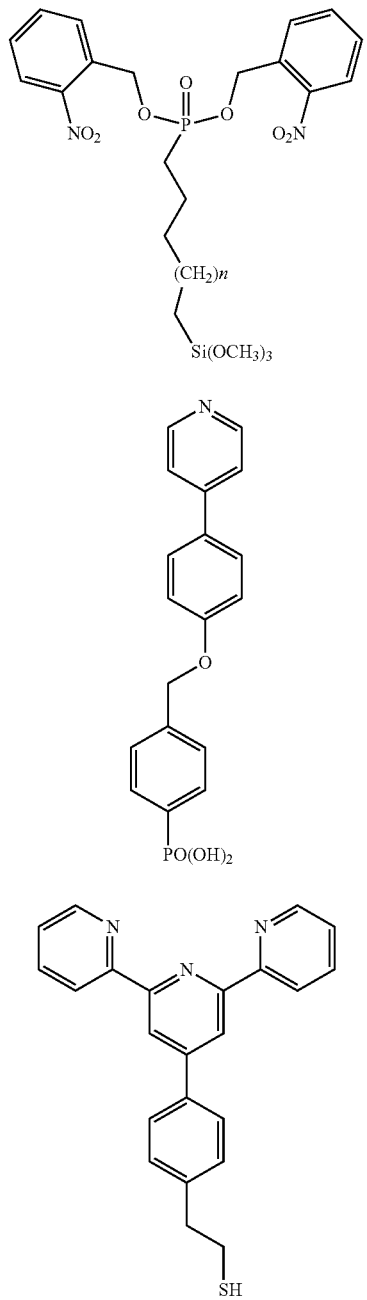

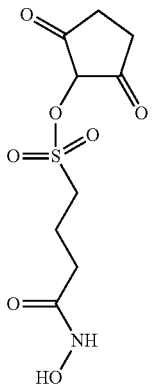

Compounds A, B, C and D are some examples of many different types of photosensitive molecular precursors that can be used n the process. Each of the compounds have a surface binding group; A, Si(OCH$_3$)$_3$; B, PO(OH)$_2$; C, thiol; and D, hydroxamic acid. Each of the compounds have a metal binding group; A, PO(OH)$_2$; B, pyridine; C, terpyridine; and D, S(O)$_2$OH. Each of the compounds have a photosensitive group; A, nitrobenzyl; B, benzyl ether; C, carbon-sulfur bond; and D, succinimidyl. Compounds B and C have internal photosensitive groups, and therefore, the binding group for attachment of metal-containing species is displaced upon exposure. Compounds A and D have external photosensitive groups, and therefore, the binding group for attachment of metal-containing species is activated upon exposure.

Again, it is to be understood that one of ordinary skill in the art can design any number of photosensitive molecular precursors with each precursor having a surface binding group, a binding group for attachment of metal-containing species and a photosensitive group. Accordingly, compounds A to D are only exemplary, and thus, the process is not restricted to these four compounds. For example, a particular photosensitive molecular precursor can be designed according to the device application and the type of radiation exposure.

Self-assembled monolayers (SAMs) can be formed on a given substrate from solution or the gas phase. The chemical interaction between specific surface binding groups of the molecular precursors and a specific substrate (dielectric, semiconductor, or metal surfaces) provides the needed control for the selective self-assembly of a precursor on a particular surface. Some of the known surface binding groups that self-assemble on surfaces include thiols and isocyanides on the noble metals (platinum, palladium, and gold) and semiconductors; dienes on silicon, chloro- and alkoxy-silanes on silicon oxide; and carboxylic acids, hydroxamic acids, and phosphonic acids on metal oxide surfaces See, A. Ulman, Chem. Rev. 96, 1533 (1996). An organic acid is an oxygen-containing acid that is capable of binding to a metal oxide surface, e.g., alumina, zirconia or hafnia. Exemplary organic acids include phosphonic acids, hydroxamic acids, carboxylic acids and suflonic acids.

The binding group for attachment of metal-containing species is used to bind a metal-containing species that will eventually provide catalytic sites for the growth of the carbon or semiconductor nanomaterials. These metal-containing species are selected from metal cations, metal compounds, and metal and metal oxide nanoparticles.

In one embodiment, the process uses a layer-by-layer assembly to increase the metal content, and therefore the density or size of catalytic sites for carbon or semiconductor nanomaterials formation. For example, the careful selection as to the size and composition (e.g., the amount of metal in metal oxide nanoparticles) of the nanoparticles can directly affect the size of both carbon nanotubes and semiconductor nanowires. Examples of metal-containing species that can be formed into multilayers include:

(a) metal ions coordinated to terpyridine, phosphonic acid [L. Brousseau and T. Mallouk, *Anal Chem.* 69, 679 (1997)], and carboxylic acid [M. Anderson, et. al. *J. Vac. Sci. Technol. B* 21, 3116, (2003)] functionalized organic ligands;

(b) metal complexes that include one or more pyridine, or isocyanide, ligands [C. Lin, C. R. Kagan, *J. Am. Chem. Soc.* 125, 336 (2002), M Ansell et. al. *Langmuir* 16, 1172 (2000), and C. R. Kagan, C. Lin, see U.S. Pat. No. 6,646,285.]; and (c) metal nanoparticles, e.g., gold nanoparticles on thiol functionalized molecules, and iron-platinum particles on polyvinylpyrrolidinone [S. Sun et. al. *J. Am. Chem. Soc.* 124, 2884 (2002)].

Following the metallization of the attached molecular precursors, the device structure is exposed to known reaction conditions for making nanomaterials, e.g., carbon nanotubes or semiconductor nanowires. The bound metal-containing species provide the necessary catalytic sites for the growth of the nanomaterials as the molecular precursor volatilizes at the elevated temperatures necessary for forming the carbon nanomaterials or semiconductor nanomaterials.

FIGS. 1(a) to 1(f) is a schematic representation of one embodiment of the process. FIG. 1(a) depicts a field-effect transistor with gate 14, gate dielectric 12, and metal source or drain electrodes 10. The self-assembly of the selected molecular precursors, which are attached to the electrodes by the surface binding groups, is depicted in FIG. 1(b). As shown, the molecular precursor 20 includes a surface binding group (square, 22) that selectively binds to a metal, semiconductor, or dielectric surface. Such surface binding groups include:

a. thiols that bind to metal and semiconductor surfaces (e.g. Au, Pd, Pt, AuPd, Si, Ge, GaAs, Cu);

b. isocyanides that bind to metal surfaces;

c. phosphonic acids, hydroxamic acids, carboxylic acids, suflonic acids that bind to metal oxide surfaces (e.g. alumina, zirconia, hathia);

d. silanes that bind to silicon oxide surfaces; and e. dienes that bind to silicon surfaces.

As shown, the molecular precursor 20 also includes a body (oval, 24) which can in some instances, facilitate the self assembly of the molecular precursor on the substrate. For example, n-stacking or hydrogen bonding between neighboring precursors can have a dramatic affect on the arrangement of molecules in the monolayer through intermolecular interactions. The body portion can, for instance, contain aromatic groups (including phenyl rings and heterocycles, and/or alkyl groups. One can also design the body portion of the molecular precursor with groups capable of forming hydrogen bonds.

The body 24 can also have groups that provide bulkiness to control the density of molecules on the surface. A more bulkier body results in a smaller number of attached precursors over a given area of substrate surface, and hence a decrease in the amount of catalyst.

As shown, the molecular precursor 20 also includes a binding group for attachment of metal-containing species (triangle, 26) that is capable of coordinating a metal cation, metal complex, or metal or metal-oxide nanoparticle. Such metal binding groups include:

a. nitrogen heterocyclic ligands e.g., pyridine, bipyridine and terpyridine which bind Fe, Co Ru, Ti, Zr, Mo and W ions, complexes, or nanoparticles;

b. sulfonic acids which coordinate Fe;

c. thiols which coordinate Au, Pd, Pt; and d. isocyanides which coordinate Au, Pd, Pt;

e. amines which bind metal oxide nanoparticles

Once attachment of the precursor to the surface is completed, the precursor is bound by attaching a metal cation, metal complex, or metal or metal-oxide nanoparticle to the metal binding group, FIG. 1(c). The attached precursors are exposed to a solution of metal cations or metal compounds or a dispersion of metal or metal oxide nanoparticles (rectangles, 30) that coordinate to the metal binding group of the precursor, thereby adding a layer of metal cations or metal compounds, or metal or metal oxide nanoparticles to the assembled precursors on the substrate surface.

Following metallization, the nanomaterials, e.g., carbon nanotubes or semiconductor nanowires, form from the substrate surface as the molecular precursor decomposes leaving the necessary catalytic sites, FIG. 1(f). If an increase in the concentration of catalytic sites is desired, additional coordinating ligands 40 can be attached to the metal cations, metal compounds, or metal or metal oxide nanoparticles bound to the molecular precursors. The organic ligands may have binding functionalities (circles, 42) such as pyridines, isocyanides, terpyridines, sulfonic acids, etc. that coordinate the metal ions or complexes, or metal or metal oxide nanoparticles both attached to the first layer of metal-containing species and to a subsequently deposited second layer of metal-containing species. This additive process can be repeated any number of times to add sufficient metal content to the substrate surface until the desired amount of catalyst is obtained for the growth of the carbon nanomaterials or semiconductor nanomaterials, FIGS. 1(d) and 1(e).

Once the desired metal content is achieved, the metal containing assembly is exposed to elevated temperatures, typically under chemical vapor deposition conditions, for the growth of the nanomaterials 50 (e.g., nanotubes or nanowires), FIG. 1(f). During this process the organic component of the molecular assembly decomposes leaving behind inorganic nanoparticles that serve as catalytic sites for the growth of the nanomaterials. The nanomaterials 50 grow from the catalyst sites and may span the electrodes 10 of the device.

FIG. 2 is a schematic representation of another embodiment of the process. As in FIG. 1, FIG. 2 represents a field-effect transistor with gate 140, gate dielectric 120, and metal source or drain electrodes 100 that are capped with a relatively non-active layer 110 to provide an electrode stack. As shown, the molecular precursors (as shown in FIG. 1) selectively attach to only the sidewalls of electrodes 100 in the electrode stack in a direction parallel to the gate dielectric 120. The non-active layer 110 can include a native oxide, which will limit diffusion of the catalytic metal sites upon exposure to the elevated temperatures later in the process.

In still another embodiment, the capping layer above can be selected for attachment of the molecular precursor with the lower metal electrode being non-reactive toward the surface binding group of the molecular precursor. The result of which would be the fabrication of suspended nano structures.

The invention is also directed to a method of forming an electronic device structure. The method comprises providing a patterned electronic surface selected from a patterned metal surface, a patterned dielectric surface or a patterned semiconductor surface. A molecular precursor is then attached to the patterned electronic surface. The molecular precursor includes a surface binding group for attachment to the patterned electronic surface and a binding group for attachment of metal-containing species. The metal-containing species is selected from a metal cation, metal compound, or metal or metal-oxide nanoparticle complexes, which attach to the metal binding group to form a metallized molecular precursor.

Alternatively, a patterned assembly of molecular precursor can be formed by exposing portions of the assembly to radiation. In this instance, the molecular precursor will include a photosensitive group. Following selective attachment to a substrate, the assembled monolayer is exposed to radiation resulting in a patterned assembly. The patterned assembly is then exposed to metal cations, metal compounds, or metal or metal oxide nanoparticles for selective positioning of the catalytic sites and the resulting carbon nanomaterials or semiconductor nanomaterials.

In still another embodiment, a single metal electrode can be used as a substrate surface, and following the formation of the nanomaterial, another electrode can be patterned on the surface to complete the device structure. Alternatively, the two metal electrodes forming the active region of the device can have different chemical reactivity towards the surface binding group of the molecular precursor. As a result, selective assembly of the catalyst on and subsequent growth of the nanomaterial only one of the electrodes in the device occurs.

While the above described embodiments depict the selective growth of carbon nanomaterials or semiconductor nanomaterials on electrode surfaces, one of ordinary skill in the art would understand that the carbon nanomaterials or semiconductor nanomaterials can be grown on a patterned metal, dielectric, or semiconductor surfaces by selectively positioning the molecular assembly. This could be achieved by patterning the underlying dielectric surface with metal oxide and silicon dioxide and using a molecular precursor that assembles on only one of the two surfaces, by using a stamp to put down a patterned monolayer, or by depositing the molecular assembly with a lithographic mask prepared by photolithography or using a block copolymer template.

Making the Carbon or Semiconductor Nanomaterials

There have been many studies directed to growing carbon nanotubes. For example, one such method is described by H. Dai, *Acc. Chem. Res.* 35, 1035 (2002). Similarly, there have been many studies directed to growing semiconductor nanomaterials. For example, one such method is described by C. M. Lieber, *MRS Bull. July*, 286 (2003). One of ordinary skill in the art can grow carbon nanotubes or semiconductor nanomaterials (e.g., nanowires) using the process of positioning catalytic sites as described in this application followed by the growth of the nanomaterials using the methods described in these two technical articles.

Applicants provide the following Examples, which help describe the process of the invention. It is intended that the specification and examples be considered as exemplary only, with a true scope and spirit of the invention being indicated by the following claims.

EXAMPLE 1

A heavily n+ doped silicon wafer, with 10 nm thermally grown silicon oxide was patterned with electrodes consisting of 10 Å Ti followed by 190 Å Pd. The patterned substrate was exposed to 1 mM mercaptoterypyridine in 50:50 toluene:ethanol for a period of 18 hrs, resulting in the assembly of mercaptoterypridine on the Pd surfaces. The samples were rinsed well in clean 50:50 toluene:ethanol and exposed to 5 mM $FeCl_3$ in ethanol for a similar period of 18 hrs. The samples were rinsed in clean ethanol and dried under a nitrogen stream.

EXAMPLE 2

A heavily n+ doped silicon wafer, with 10 nm thermally grown silicon oxide was patterned with electrodes consisting of 10 Å Ti followed by 190 Å Pd. The patterned substrate was exposed to 1 mM mercaptoterypyridine in 50:50 toluene:ethanol for a period of 18 hrs, resulting in the assembly of mercaptoterypridine on the Pd surfaces. The samples were rinsed well in clean 50:50 toluene:ethanol and exposed to dispersion of iron oxide nanoparticles in hexane for a period of 18 hrs. The samples were rinsed in clean hexane and dried under a nitrogen stream.

EXAMPLE 3

A heavily n+ doped silicon wafer, with 10 nm thermally grown silicon oxide was patterned with electrodes consisting of 10 Å Ti followed by 190 Å Pd. The patterned substrate was exposed to 1 mM aminoethanethiol in ethanol for 18 hrs, resulting in the assembly of aminoethanethiol on the Pd surfaces. The samples were rinsed well with clean ethanol and exposed to a dispersion of iron oxide nanoparticles in hexane for a period of 18 hrs. The samples were rinsed in clean hexane and dried under a nitrogen stream.

EXAMPLE 4

A heavily n+ doped silicon wafer with 10 nm thermally grown silicon oxide was pattered with an electrode stack consisting of 10 Å Ti, 50 Å Pd, and 140 Å Al. The pattered substrate was exposed to 1 mM mercaptoterpyridine in 50:50 toluene:ethanol for a period of 18 hrs. The Ti and Al surfaces form a native surface oxide that is subsequently non-reactive towards mercaptoterpyridine, resulting in the selective assembly of mercaptoterpyridine on the exposed Pd sidewalls of the metal stack. The samples were rinsed well in clean 50:50 toluene:ethanol and exposed to 5 mM $FeCl_3$ in ethanol for a period of 18 hrs. The samples were rinsed in clean ethanol and dried under a nitrogen stream.

EXAMPLE 5

A heavily n+ doped silicon wafer with 10 nm thermally grown silicon oxide was pattered with an electrode stack consisting of 10 Å Ti, 50 Å Pd, and 140 Å Al. The pattered substrate was exposed to 1 mM aminoethanethiol in ethanol for a period of 18 hrs. The Ti and Al surfaces form a native surface oxide that is subsequently non-reactive towards aminoethanethiol, resulting in the selective assembly of aminoethanethiol on the exposed Pd sidewalls of the metal stack. The samples were rinsed well in clean ethanol and exposed to a dispersion of iron oxide nanoparticles in hexane for a period of 18 hrs. The samples were rinsed in clean hexane and dried under a nitrogen stream.

EXAMPLE 6

Each of the deposited structures of Examples 1-5 were placed on a quartz boat in a 1-inch dimater quartz tube reactor for CVD growth of carbon nanotubes. The tube reactor was heated to 870° C. under a flow of 5% $H_2$ in Ar (rate ~2700 sccm). The carbon nanotubes were formed by bubbling a 5% $H_2$ in Ar gas mixture through a bottle of ethanol, cooled to 0°

C., and flowing it over the samples at 870° C. for 7 minutes. The reactor was then allowed to cool to room temperature under flowing Ar.

Figure 4:
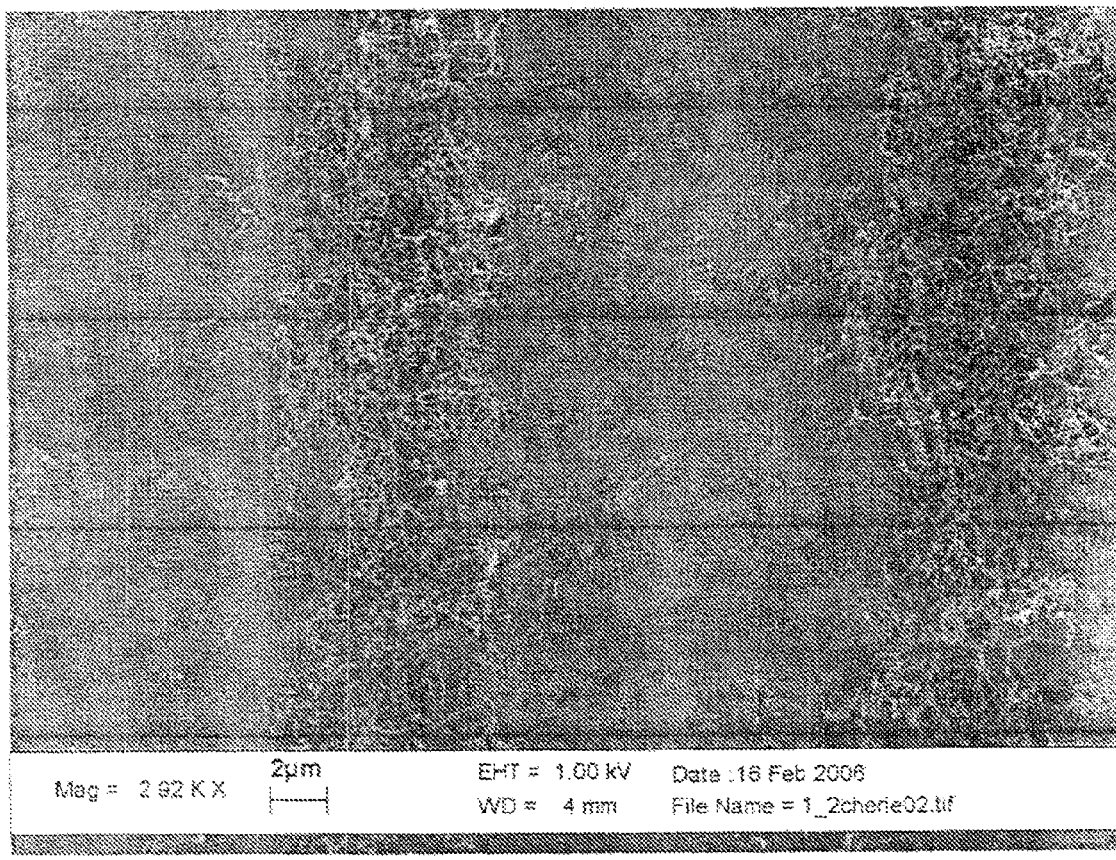
FIG. 4 is a scanning electron micrograph of grown carbon nanotubes using another process of the invention.

FIG. 3 is a scanning electron micrograph of grown carbon nanotubes using the deposited catalytic sites of FeCl$_3$ of Example 1. Likewise, FIG. 4 is a scanning electron micrograph of grown carbon nanotubes using the deposited catalytic sites of FeCl$_3$ of Example 4. In the capped electrode of Example 4, the total number of grown nanotubes was greatly reduced as the catalytic sites were limited to the Pd sidewall.

The foregoing description illustrates and describes the present disclosure. Additionally, the disclosure shows and describes only the preferred embodiments of the disclosure, but, as mentioned above, it is to be understood that it is capable of changes or modifications within the scope of the concept as expressed herein, commensurate with the above teachings and/or the skill or knowledge of the relevant art. Accordingly, the description is not intended to limit the invention to the form disclosed herein.

We claim:

1. A transistor comprising:
a first electrode and a second electrode on a gate dielectric located or a substrate;
and carbon nanomaterials or semiconductor nanomaterials located above the gate dielectric or substrate and between the first electrode and second electrode; wherein said carbon nanomaterials or semiconductor nanomaterials are obtainable by attaching a molecular precursor to the first electrode, the second electrode or both the first and the second electrodes, wherein the molecular precursor includes a surface binding group for metal attachment to at least one electrode and a binding group for attachment of metal-containing species; complexing the binding group for attachment of metal-containing species with a metal-containing species selected from a metal cation, metal compound, or metal or metal-oxide nanoparticle to form a metallized molecular precursor; and heating the metallized molecular precursor to provide a catalytic site from which the carbon nanomaterials or semiconductor nanomaterials form.

2. The transistor of claim 1 wherein the first electrode and the second electrode are capped with a non-reactive layer such that the molecular precursor attaches substantially at the sidewalls of the electrodes, and following complexation and heating the formed carbon nanomaterials or semiconductor nanomaterials extend along the surface of the gate dielectric or the substrate.

3. A transistor comprising:
at least two segments of a non-reactive layer on a gate dielectric or a substrate;
a first electrode and a second electrode on each of the at least two non-reactive layers; and carbon nanomaterials or semiconductor nanomaterials located above the gate dielectric or substrate and between the first electrode and second electrode; wherein said carbon nanomaterials or semiconductor nanomaterials are obtainable by attaching a molecular precursor to the first electrode, the second electrode or both the first and the second electrodes, wherein the molecular precursor includes a surface binding group for attachment to at least one electrode and a binding group for attachment of metal-containing species; complexing the binding group for attachment of metal-containing species with a metal-containing species selected from a metal cation, metal compound, or metal or metal-oxide nanoparticle to form a metallized molecular precursor; and heating the metallized molecular precursor to provide a catalytic site from which the carbon or semiconductor nanomaterials form above the gate dielectric or the substrate.

4. An electronic device structure comprising:
a patterned electronic surface selected from a patterned metal surface, patterned dielectric surface or patterned semiconductor surface; and carbon nanomaterials or semiconductor nanomaterials located on the surface; wherein said carbon nanomaterials or semiconductor nanomaterials are obtainable by attaching a molecular precursor to the patterned electronic surface, wherein the molecular precursor includes a surface binding group for attachment to the patterned electronic surface and a binding group for attachment of metal-containing species; complexing the binding group for attachment of metal-containing species with a metal containing species selected from a metal cation, metal compound, or metal or metal-oxide nanoparticle to form a metallized molecular precursor; and heating the metallized molecular precursor to provide a catalytic site on the patterned electronic surface from which the carbon nanomaterials or semiconductor nanomaterials form.

5. The electronic device of claim 4 wherein the surface binding group is selected from the group consisting of chloro silane, alkoxy silane and the patterned electronic surface comprises silicon.

6. The electronic device of claim 4 wherein the surface binding group is an organic acid and the substrate comprises a metal oxide surface.

7. The electronic device of claim 4 wherein the surface binding group is a thiol and the patterned electronic surface comprises one or more metals selected from the group consisting of gold, palladium, platinum and copper, or the surface binding group is a thiol and the patterned electronic surface is a semiconductor material selected from silicon, germanium or gallium arsenide.

8. The transistor of claim 1 wherein the surface binding group is a diene and the substrate comprises silicon.

9. The electronic device of claim 4 wherein the surface binding group is a diene and the patterned electronic surface comprises silicon.

10. The transistor of claim 1 wherein the metal cation, the metal compound or the metal or metal oxide nanoparticle contains a metal selected from the group consisting of iron, cobalt, nickel, palladium, platinum, rhodium, ruthenium, titanium, zirconium and gold.

* * * * *